(12) United States Patent
Shoki

(10) Patent No.: US 8,399,160 B2
(45) Date of Patent: Mar. 19, 2013

(54) MULTILAYER REFLECTIVE FILM COATED SUBSTRATE, REFLECTIVE MASK BLANK, AND METHOD OF MANUFACTURING A REFLECTIVE MASK

(75) Inventor: Tsutomu Shoki, Tokyo (JP)

(73) Assignee: Hoya Corporation, Tokyo (JP)

( * ) Notice: Subject to any disclaimer, the term of this patent is extended or adjusted under 35 U.S.C. 154(b) by 137 days.

(21) Appl. No.: 13/122,322

(22) PCT Filed: Nov. 11, 2009

(86) PCT No.: PCT/JP2009/069165
§ 371 (c)(1),
(2), (4) Date: May 16, 2011

(87) PCT Pub. No.: WO2010/061725
PCT Pub. Date: Jun. 3, 2010

(65) Prior Publication Data
US 2011/0217634 A1    Sep. 8, 2011

(30) Foreign Application Priority Data
Nov. 27, 2008    (JP) .................................. 2008-301972

(51) Int. Cl.
*G03F 1/38* (2012.01)
*G03F 1/42* (2012.01)

(52) U.S. Cl. ............................................. 430/5; 430/22

(58) Field of Classification Search ................ 430/5, 22; 356/399, 401
See application file for complete search history.

(56) References Cited

U.S. PATENT DOCUMENTS

| 7,211,354 B2 | 5/2007 | Itoh |
| 2003/0184721 A1 | 10/2003 | Itoh |
| 2007/0015065 A1 | 1/2007 | Abe et al. |

FOREIGN PATENT DOCUMENTS

| JP | 2003-248299 A | 9/2003 |
| JP | 2006-324268 A | 11/2006 |
| JP | 2007-033857 A | 2/2007 |
| WO | 2008/129914 A1 | 10/2008 |

*Primary Examiner* — Stephen Rosasco
(74) *Attorney, Agent, or Firm* — Sughrue Mion, PLLC

(57) ABSTRACT

Provided is a reflective mask blank, wherein even if inspection light for defect inspection is irradiated onto an uppermost surface of a multilayer reflective film or of an absorber film formed over a reference point mark, sufficient contrast is obtained between a position of the reference point mark and its peripheral portion so that the position of the reference point mark can be identified with high accuracy. By forming a reference point mark (11) in the form of a recess having a depth of 10 μm or more and a width of 80 μm or more on a main surface of a substrate (12), even if a multilayer reflective film (13), an absorber film (15), and so on are formed over the reference point mark (11), sufficient contrast for the inspection light is obtained so that the position of the reference point mark (11) can be identified with high accuracy.

9 Claims, 2 Drawing Sheets

MULTILAYER REFLECTIVE FILM COATED SUBSTRATE, REFLECTIVE MASK BLANK, AND METHOD OF MANUFACTURING A REFLECTIVE MASK

CROSS REFERENCE TO RELATED APPLICATIONS

This application is a National Stage of International Application No. PCT/JP2009/069165 filed Nov. 11, 2009, which claims priority from Japanese Patent Application No. 2008-301972 filed Nov. 27, 2008, the contents of all of which are incorporated herein by reference in their entirety.

TECHNICAL FIELD

This invention relates to a multilayer reflective film coated substrate, a reflective mask blank, and a method of manufacturing a reflective mask.

BACKGROUND ART

In recent years, with higher integration of semiconductor devices, patterns finer than the transfer limit of the photolithography technique using the conventional ultraviolet light have been required in the semiconductor industry. In order to enable transfer of such fine patterns, the EUV lithography being an exposure technique using extreme ultraviolet light (hereinafter referred to as EUV light) with a shorter wavelength is expected to be promising. Herein, the EUV light represents light in a wavelength band of the soft X-ray region or the vacuum ultraviolet region and, specifically, light having a wavelength of about 0.2 nm to 100 nm.

As an exposure mask for use in this EUV lithography, use is normally made of a reflective mask in which a multilayer reflective film (multilayer film) for reflecting the EUV light serving as exposure light is formed on a substrate (base substrate) and, further, an absorber film (metal film) for absorbing the EUV light is formed in a pattern on the multilayer reflective film.

When pattern transfer is carried out using an exposure apparatus (pattern transfer apparatus) with such a reflective mask mounted therein, the exposure light incident on the reflective mask is absorbed at a portion where the absorber film pattern is present, while, is reflected by the multilayer reflective film at a portion where the absorber film pattern is not present so that the reflected light is transferred onto, for example, a semiconductor substrate (resist-coated silicon wafer) through a reflective optical system.

On the other hand, with the increasing demand for miniaturization in the photolithography process, problems in the photolithography process used in the semiconductor manufacturing processes are becoming remarkable. As one of them, there is cited a problem of a defect of a photomask substrate formed with a pattern, which is used in the photolithography process.

Conventionally, the existing position of a defect of a photomask substrate is specified by the distance from an end face of the substrate. As a consequence, the positional accuracy is low and thus, when patterning a light-shielding film while avoiding the defect, it is difficult to avoid it on the order of μm. Therefore, the defect is avoided by changing the direction of pattern transfer or roughly shifting the pattern transfer position on the order of mm.

Under these circumstances, for the purpose of increasing the inspection accuracy of a defect position in a light-transmitting mask, there is an attempt to form a reference mark on a transparent substrate and to specify a position of a defect using the reference mark as a reference position (e.g. Patent Document 1). In the invention described in this publication, the reference mark is formed to be very shallow (depth is about 3 μm) so as to prevent dust from staying in a recess serving as the reference mark. In the case of a normal light-transmitting mask, although a thin film such as a light-shielding film is formed on an upper surface of a reference mark, since it comprises a single layer or about several layers, even if the depth of the reference mark is shallow, it is possible to obtain contrast for inspection light (deep-ultraviolet light of about 190 to 260 nm, or the like) and thus to recognize a position of the reference mark in a defect inspection.

PRIOR ART DOCUMENT

Patent Document

Patent Document 1: JP-A-2003-248299

SUMMARY OF THE INVENTION

Problem to be Solved by the Invention

However, if this reference mark in the form of the recess having a cross-sectional shape in which the width decreases from the main surface toward the bottom of the recess is applied to a reflective mask blank, since a multilayer reflective film in the form of films laminated by several tens of cycles is stacked on an upper surface of the reference mark, the depth and width of the recess tend to decrease as compared with a normal light-shielding film of the same thickness. As a consequence, if the depth is only about 3 μm, the depth and width of the recess decrease upon laminating each layer of the multilayer reflective film so that the contrast for inspection light (deep-ultraviolet light of about 190 to 260 nm, or the like) cannot be obtained. Further, if a capping film, a buffer film, and an absorber film are formed on this multilayer reflective film, the depth of the recess further decreases.

In the case of a light-transmitting mask blank, defects include a defect present in a glass substrate and a defect present in a light-shielding film. With respect to the defect of the glass substrate, it can be judged whether or not the glass substrate is usable according to the number and positions of defects in an inspection after a polishing process of the glass substrate is finished. Therefore, importance is attached to avoiding the defect of the light-shielding film. With respect to the defect of the light-shielding film, defect correction with FIB or the like can be carried out at an unavoidable portion.

On the other hand, in the case of a reflective mask blank, since EUV exposure light does not transmit a glass substrate and a defect on a surface of the glass substrate directly affects a multilayer reflective film, a defect of the multilayer reflective film particularly becomes a problem. Although a defect inspection is carried out also for the substrate after the formation of the multilayer reflective film, since defects of the multilayer reflective film are caused by many factors such as a surface defect of the substrate, the incorporation of particles in the formation of the multilayer reflective film, and so on, the defect occurrence rate is high as compared with the light-transmitting mask blank. Therefore, if the selection criterion is set too strict, the yield is largely degraded.

Accordingly, this should be dealt with by lowering the allowable defect criterion and to arrange a transfer pattern so as not to expose a defective portion of the multilayer reflective film (i.e. so as to cover the defective portion with an absorber film). However, for this, it is essential to specify a planar position of the defect with high accuracy.

It is an object of this invention to provide a multilayer reflective film coated substrate in which a multilayer reflective film is formed on a glass substrate with a reference point mark given at a predetermined position, or a reflective mask blank in which an absorber film is formed on the multilayer reflective film coated substrate, wherein even if inspection light is irradiated onto an uppermost surface of the multilayer reflective film or of the absorber film formed over the reference point mark in a defect inspection, sufficient contrast is obtained between a position of the reference point mark and its peripheral portion so that the position of the reference point mark can be identified with high accuracy.

Means for Solving the Problem

In order to achieve the above-mentioned object, the present inventor has considered to form, on a main surface of a substrate, a recess having a depth of 10 μm or more and a width of 80 μm or more and having a cross-sectional shape in which the width decreases from the main surface toward a bottom of the recess, and to use this recess as a reference point mark.

Specifically, according to this invention, a multilayer reflective film coated substrate for a reflective mask comprises a substrate and a multilayer reflective film having a structure in which high refractive index layers composed mainly of a high refractive index material and low refractive index layers composed mainly of a low refractive index material are alternately laminated on a main surface of the substrate. A reference point mark is formed on the main surface of the substrate at a predetermined position of a portion where the multilayer reflective film is formed, the reference point mark being in the form of a recess having a width of 80 μm or more and a depth of 10 μm or more and having a cross-sectional shape in which the width decreases from the main surface toward a bottom of the recess.

In the aforementioned multilayer reflective film coated substrate for the reflective mask, it is preferable that the position where the reference point mark is formed is located outside of a pattern forming area of the reflective mask, and further, inside by a predetermined width from an outer edge of the substrate. Furthermore, it is more preferable that the number of reference point marks is three or more and the three or more reference point marks are formed at positions that are not aligned in a straight line.

The reflective mask blank according to this invention comprises an absorber film, which is adapted to absorb exposure light, on the multilayer reflective film of the aforementioned multilayer reflective film coated substrate for the reflective mask. It is preferable that the absorber film is formed of a material composed mainly of Ta. Further, it is desirable that the reflective mask blank comprises a buffer film composed mainly of Cr or a capping film composed mainly of Ru or Nb and interposed between the multilayer reflective film and the absorber film.

A method of manufacturing a reflective mask according to this invention comprises a step of patterning the absorber film of the aforementioned reflective mask blank into a predetermined shape.

Effect of the Invention

According to a multilayer reflective film coated substrate of this invention, by forming, on a main surface of a substrate, a reference point mark in the form of a recess having a depth of 10 μm or more and a width of 80 μm or more and having a cross-sectional shape in which the width decreases from the main surface toward a bottom of the recess, even if a multilayer reflective film is formed over the reference point mark, sufficient contrast for inspection light for defect inspection is obtained so that a position of the reference point mark can be identified with high accuracy. As a consequence, there is obtained the multilayer reflective film coated substrate that can specify a position of a defect with an accuracy on the order of μm using the reference point mark as a reference. Further, even in the case where a reflective mask blank is manufactured by forming an absorber film and so on an upper surface of this multilayer reflective film coated substrate, sufficient contrast can be obtained between the reference point mark and its peripheral portion even by irradiating the inspection light onto the absorber film. Since the position of the defect can be specified with the accuracy on the order of μm, the defect can be accurately avoided upon patterning the absorber film into a transfer pattern so that it is possible to manufacture a reflective mask with high accuracy.

MODE FOR CARRYING OUT THE INVENTION

Hereinbelow, an embodiment of this invention will be described with reference to figures, Examples, and so on. These figures, Examples, etc. and the description are only illustrative of this invention and do not limit the scope of this invention. It is needless to say that other embodiments can also belong to the category of this invention as long as they agree with the gist of this invention.

Figure 1:
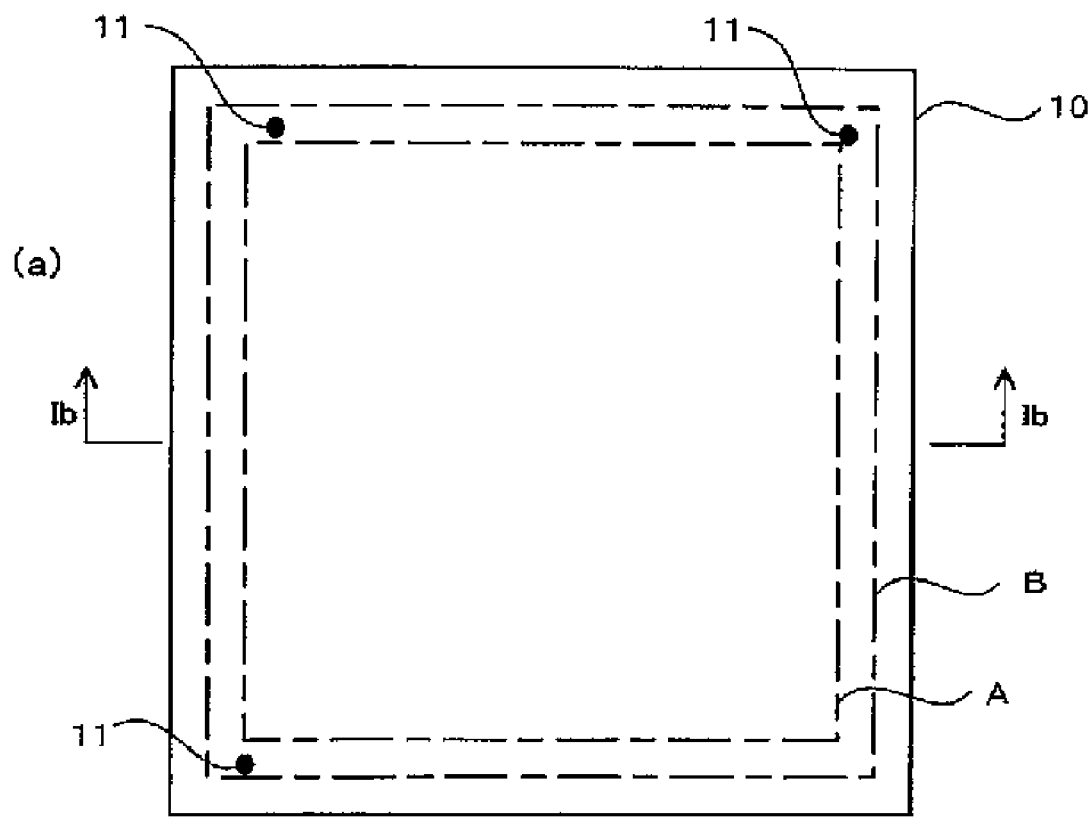
FIG. 1 is diagrams for explaining a reflective mask blank in an embodiment of this invention.
Figure 1:
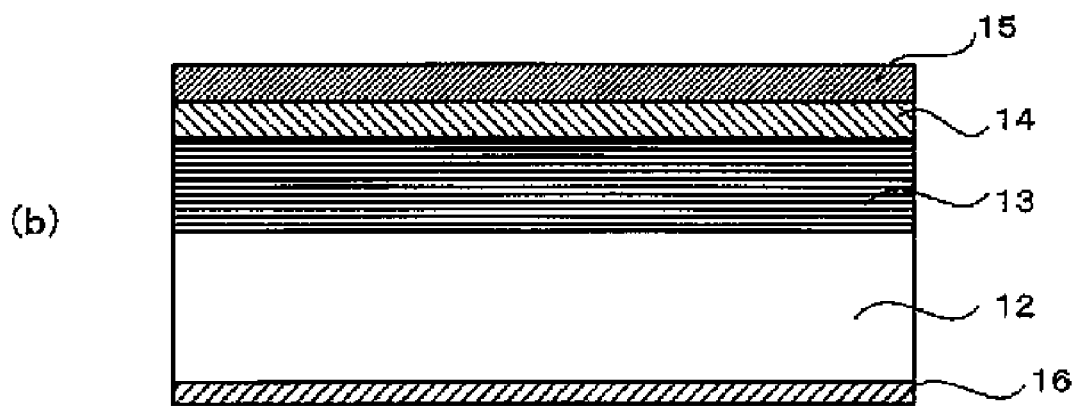

FIG. 1 shows diagrams for explaining a reflective mask blank according to the embodiment of this invention. FIG. 1 (a) is a plan view of the reflective mask blank and FIG. 1 (b) is a cross-sectional view taken along Ib-Ib of FIG. 1 (a).

As shown in FIG. 1 (a), a reflective mask blank 10 according to the embodiment of this invention has reference point marks 11 thereon. In the same figure, an example having three reference point marks 11 is shown as one example. An area for forming the reference point marks is suitably an area which is located outside of a pattern forming area (e.g. in the case of a 152 mm square substrate, outside of 132 mm square of a main surface) serving as an area for forming a transfer pattern when a reflective mask is manufactured using this reflective mask blank 10 and which is located inside by a predetermined width (e.g. 5 mm) from the outer edge of the reflective mask blank 10 (e.g. in the case of the 152 mm square substrate, inside of 142 mm square of the main surface). This is because the transfer pattern and the reference point mark may overlap each other inside of the pattern forming area, while, the flatness is not good in the vicinity of the outer edge of the reflective mask blank 10 so that there is a possibility of the occurrence of position offset or the like upon forming the reference point mark. In FIG. 1 (a), a chain line A represents a boundary of the transfer pattern area while a chain line B represents a boundary with respect to the vicinity of the outer edge (the predetermined width from the outer edge) of the reflective mask blank 10.

The shape of the main surface, on the side where the reference point marks are to be formed (on the side where a multilayer reflective film is to be formed), of the substrate is preferably such that, for example, in the case of the 152 mm square substrate, the flatness in the area inside of 142 mm square is 0.3 μm or less and the shape thereof is a convex shape which is relatively high at its central portion and relatively low at its peripheral portion.

As shown in FIG. 1 (b), the reflective mask blank 10 according to the embodiment of this invention has a substrate 12, a multilayer reflective film 13 formed on a main surface of the substrate 12, a buffer film 14 formed on the multilayer reflective film 13, and further an absorber film 15 formed on the buffer film 14, and has at least a conductive film 16 on the back side of the substrate 12. The multilayer reflective film 13 has a structure in which high refractive index layers composed mainly of a high refractive index material and low refractive index layers composed mainly of a low refractive index material are alternately laminated.

As an example of this multilayer reflective film 13, there can be cited a Mo/Si multilayer reflective film in which Mo as a high refractive index material and Si as a low refractive index material are alternately laminated by a plurality of cycles. Other than this, there can be cited a Mo/Be multilayer reflective film, a Ru/Si multilayer reflective film, a Si/Nb multilayer reflective film, a MoC/Si multilayer reflective film, a Mo compound/Si compound multilayer reflective film, a Mo/MoC/Si multilayer reflective film, and so on. As lamination cycles of the multilayer reflective film, 30 or more cycles are necessary for setting the reflectance for EUV exposure light to 50% or more, 35 or more cycles are preferable for setting it to 60% or more, and 40 cycles are optimal. In these cases, the total thickness of the multilayer reflective film is preferably 210 nm or more and 300 nm or less.

The composite in the state where the multilayer reflective film 13 is formed on the substrate 12 before the formation of the buffer film 14, the absorber film 15, and the conductive film 16 is called a multilayer reflective film coated substrate.

Figure 2:
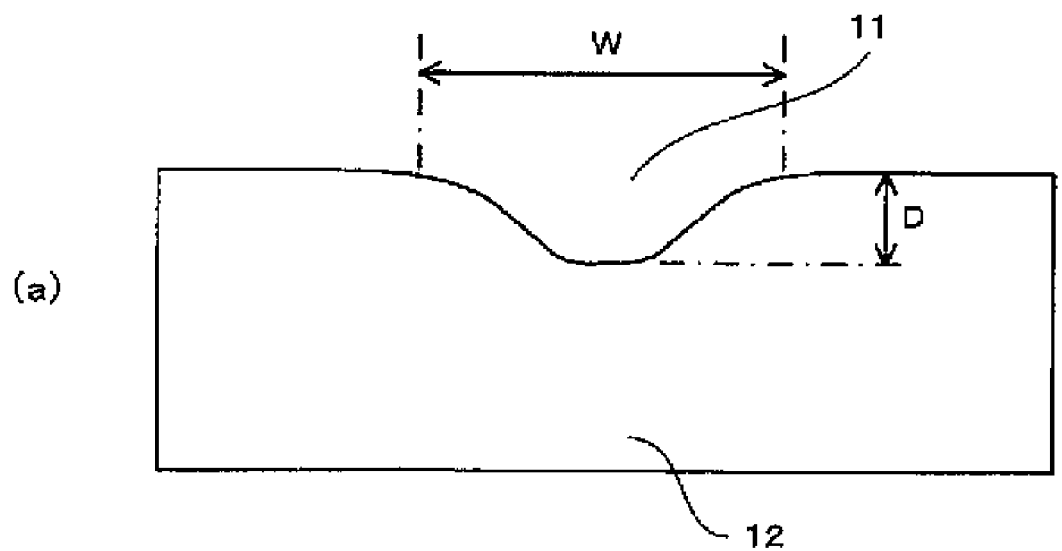
FIG. 2 is diagrams for explaining a reference point mark in the embodiment of this invention.
Figure 2:
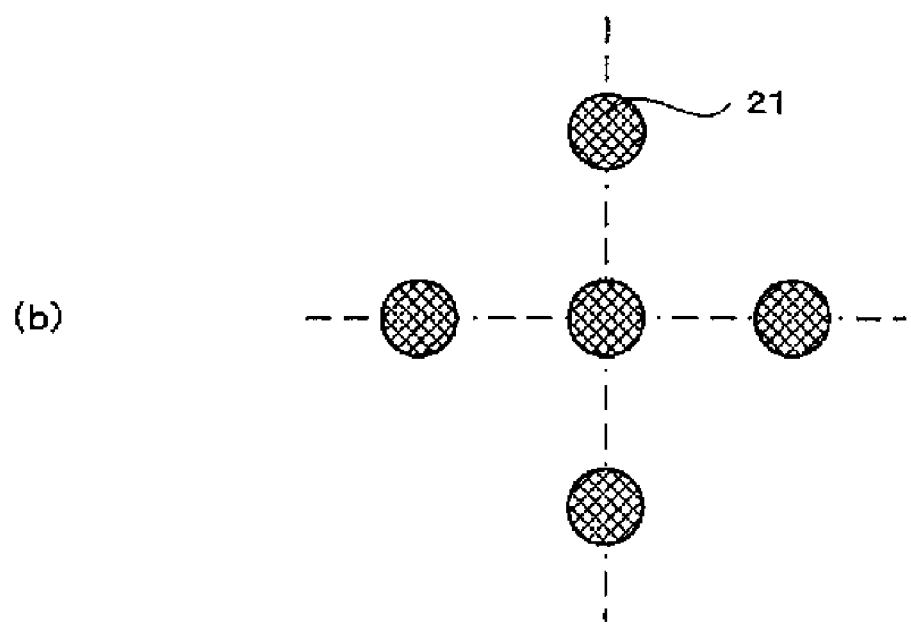

Next, using FIG. 2, the shape of the reference point mark 11 will be described. FIG. 2 (a) is an enlarged view of a cross-section of the reference point mark 11 formed on the substrate 12. The shape of the reference point mark 11 is circular as seen from above the substrate main surface (in plan view) and is a concave shape formed conically in a depth direction. The size is preferably such that the width of the widest portion (indicated by W in FIG. 2 (a)) is 80 μm or more and the depth (indicated by D in FIG. 2 (a)) is 10 μm or more.

As the reference point mark 11, other than the above-mentioned structure in which a single recess is provided, there is considered a structure in which, as shown in an enlarged plan view given as FIG. 2 (b), a recess 21 is provided and, around it, four recesses 21 are further provided at regular intervals in up-and-down and right-and-left directions in plan view, i.e. a structure in which the recesses 21 are arranged in a cross shape in plan view. There is also considered a structure formed by digging down the substrate into a cross-line shape in plan view.

According to the reflective mask blank 10 described above, by forming the reference point mark 11 in the form of the recess having the depth of 10 μm or more and the width of 80 μm or more on the main surface of the substrate, even if the multilayer reflective film 13, the buffer film 14, and the absorber film 15 are formed over the reference point mark 11, sufficient contrast for inspection light for defect inspection is obtained so that a position of the reference point mark 11 can be identified with high accuracy. As a consequence, there is obtained the reflective mask blank 10 that can specify a position of a defect with an accuracy on the order of μm using the reference point mark 11 as a reference. Even in the case where a conductive film is formed in the range of 30 nm or less (e.g.

5 nm) between the substrate 12 and the multilayer reflective film 13 for ensuring the conductivity, the reference point mark 11 is sufficiently detectable with the same depth and width as described above. The same effect can also be obtained with the multilayer reflective film coated substrate before the formation of the buffer film 14, the absorber film 15, and the conductive film 16.

If, as shown in FIG. 1 (a), three or more reference point marks 11 are provided and these three or more reference point marks are disposed at positions that are not aligned in a straight line, the position of the defect can be specified more accurately, which is thus preferable.

Next, a method of forming the reference point mark 11 on the substrate 12 will be described. The reference point mark 11 can be formed, for example, by irradiating carbon dioxide laser light (laser power is, for example, 20 mW) onto the substrate main surface. Other than this, it is also possible to use a method of forming the reference point mark 11 by pressing a needle made of a high-hardness material, such as a diamond needle, against the substrate main surface, or the like.

EXAMPLES 1 TO 5

Hereinbelow, as Examples 1 to 5, there are shown the results of manufacturing reflective mask blanks each using a glass substrate having a reference point mark of the shape shown in FIG. 2 and examining whether identification of each reference point mark is good or bad.

First, a glass substrate of 6-inch square (152.4 mm×152.4 mm×6.35 mm) was used as a substrate and a reference point mark was formed in an area outside of a 132 mm square area (this area is a transfer pattern area) with respect to the center of a substrate main surface and inside of a 142 mm square area. This is because the area inside of 132 mm square is an area where a transfer pattern is to be formed, while, in the area outside of 142 mm square, the flatness is not good so that there is a possibility of the occurrence of position offset or the like upon forming the reference point mark.

As the reference point mark, a recess was formed using the carbon dioxide laser described above. By changing the irradiation conditions of the carbon dioxide laser, there were prepared several kinds of glass substrates with different shapes of the reference point marks.

Then, a multilayer reflective film coated substrate was manufactured by forming a multilayer reflective film on the main surface of each glass substrate. In the manufacture of the multilayer reflective film coated substrate, Si layers (low refractive index layers) and Mo layers (high refractive index layers) suitable as reflective films in the range of 13 to 14 nm being a wavelength of EUV exposure light were laminated on the substrate by ion beam sputtering, thereby forming a multilayer reflective film with a total thickness of 291 nm (a Si layer was first formed to 4.2 nm, then a Mo layer was formed to 2.8 nm and, given that this formed one cycle, layers were laminated by 40 cycles, and then finally a Si film was formed to 11 nm). In the formation of each Mo layer, scattering particles from a Mo target were caused to be incident at an oblique angle of 63° with respect to a direction perpendicular to the substrate (oblique incidence film formation). In the formation of each Si layer, scattering particles from a Si target were caused to be incident in a direction perpendicular to the substrate (normal incidence film formation).

Then, a reflective mask blank was manufactured based on each multilayer reflective film coated substrate. A buffer film made of chromium nitride (CrN:N=10 at %) was formed on an upper surface of the multilayer reflective film. The film formation was carried out by a DC magnetron sputtering apparatus and the film thickness was set to 10 nm. Further thereon, an absorber film made of tantalum boron nitride (TaBN) was formed to a thickness of 50 nm. The film formation was carried out by a DC magnetron sputtering apparatus using a TaB alloy target (Ta:B=80:20 at % ratio) and using a mixed gas of a xenon (Xe) gas and a nitrogen gas ($N_2$) (Xe:$N_2$=12.9:6 flow rate ratio) as a sputtering gas.

Further, on the back side of the glass substrate, a conductive film made of chromium nitride (CrN:N=10 at %) was formed to a thickness of 70 nm. The film formation was carried out by a DC magnetron sputtering apparatus.

With respect to several kinds of reflective mask blanks with different shapes (diameter W and depth D) of the reference point marks manufactured by the method described above, it was confirmed whether identification of each reference point mark was good or bad.

Using a mask inspection apparatus KLA-5 Series manufactured by KLA-Tencor Corporation, it was confirmed whether identification of each of the reference point marks of several diameters and depths was good or bad. The results thereof are shown in Table 1.

TABLE 1

| | Reference Point Mark Diameter W (μm) | Reference Point Mark Depth D (μm) | Reference Point Mark Identification Condition |
|---|---|---|---|
| Example 1 | 100 | 30 | good |
| Example 2 | 100 | 20 | good |
| Example 3 | 100 | 10 | good |
| Comparative Example 1 | 100 | 8 | identification difficult |
| Comparative Example 2 | 100 | 5 | identification failed |
| Example 4 | 90 | 10 | good |
| Example 5 | 80 | 10 | good |
| Comparative Example 3 | 70 | 10 | identification failed |
| Comparative Example 4 | 75 | 10 | identification failed |
| Comparative Example 5 | 77 | 10 | identification difficult |

As seen from Table 1, in the case where the diameter W of the reference point mark was 100 μm, the reference point mark was recognized well when the depth D was 10 μm or more (Examples 1, 2, 3), while, the reference point mark was not recognized well when the depth D was less than 10 μm (Comparative Examples 1, 2). Further, in the case where the depth D of the reference point mark was 10 μm, the reference point mark was recognized well when the diameter W was 80 μm or more (Examples 4, 5), while, the reference point mark was not recognized well when the diameter W was less than 80 μm (Comparative Examples 3, 4, 5).

From the results described above, it is seen that when the shape of the reference point mark is such that the diameter W is 80 μm or more and the depth D is 10 μm or more, it is possible to obtain the reflective mask blank in which the reference point mark can be recognized well.

When a reflective mask is manufactured using a reflective mask blank according to this invention, since a reference point mark can be recognized well, a position of a defect in the reflective mask blank can be accurately specified. As a consequence, by patterning an absorber film into a transfer pattern while accurately avoiding the defect, it is possible to manufacture the reflective mask with few defects.

This invention is not limited to the above-mentioned embodiment and can be carried out with appropriate changes thereto. For example, while, in the above-mentioned embodiment, the buffer film made of chromium nitride was formed between the multilayer reflective film and the absorber film, a capping film composed mainly of Ru or Nb may be formed between the multilayer reflective film and the absorber film. The thickness of this capping film is preferably set in the range of about 2 nm to 5 nm.

Further, a low-reflection layer made of tantalum boron oxide (TaBO) may be formed on an upper surface of the absorber layer. The thickness of the layer is preferably set to 15 nm. The film formation can be carried out by a DC magnetron sputtering apparatus using a TaB alloy target (Ta:B=80:20 at % ratio) and using a mixed gas of an argon (Ar) gas and an oxygen gas ($O_2$) (Ar:$O_2$=58:32.5 flow rate ratio) as a sputtering gas.

The materials, sizes, processing sequences, and so on in the above-mentioned embodiment are only examples and this invention can be carried out by changing them in various ways within a range capable of exhibiting the effect of this invention. Other than that, this invention can be carried out with appropriate changes within a range not departing from the object of this invention.

The invention claimed is:

1. A multilayer reflective film coated substrate for a reflective mask, comprising:
    a substrate and,
    a multilayer reflective film having a structure in which high refractive index layers composed mainly of a high refractive index material and low refractive index layers composed mainly of a low refractive index material are alternately laminated on a main surface of the substrate,
    wherein a reference point mark is formed on the main surface of the substrate at a predetermined position of a portion where the multilayer reflective film is formed, the reference point mark being in the form of a recess having a width of 80 μm or more and a depth of 10 μm or more and having a cross-sectional shape in which the width decreases from the main surface toward a bottom of the recess.

2. The multilayer reflective film coated substrate for the reflective mask according to claim 1, wherein the position where the reference point mark is formed is located outside of a pattern forming area of the reflective mask.

3. The multilayer reflective film coated substrate for the reflective mask according to claim 1, wherein the position where the reference point mark is formed is located inside by a predetermined width from an outer edge of the substrate.

4. The multilayer reflective film coated substrate for the reflective mask according to claim 1, wherein the number of reference point marks is three or more and the three or more reference point marks are formed at positions that are not aligned in a straight line.

5. A reflective mask blank, comprising:
    an absorber film, which is adapted to absorb exposure light, on the multilayer reflective film of the multilayer reflective film coated substrate for the reflective mask according to claim 1.

6. The reflective mask blank according to claim 5, wherein the absorber film is formed of a material composed mainly of Ta.

7. The reflective mask blank according to claim 6, comprising:

a buffer film composed mainly of Cr between the multilayer reflective film and the absorber film.

8. The reflective mask blank according to claim 6, comprising:

a capping film composed mainly of Ru or Nb between the multilayer reflective film and the absorber film.

9. A method of manufacturing a reflective mask, comprising a step of: patterning the absorber film of the reflective mask blank according to claim 5 into a predetermined shape.

* * * * *